(12) United States Patent
Liu

(10) Patent No.: US 6,273,344 B1
(45) Date of Patent: Aug. 14, 2001

(54) DISPENSING NOZZLE DEVICE

(76) Inventor: Yu-Tsai Liu, No. 818, Wen-San Road, Up Mountain Village, Chung-Lin Hsiang, Hsinchu, 307 (TW)

(*) Notice: Subject to any disclaimer, the term of this patent is extended or adjusted under 35 U.S.C. 154(b) by 0 days.

(21) Appl. No.: 09/560,669

(22) Filed: Apr. 27, 2000

(30) Foreign Application Priority Data

Sep. 9, 1999 (TW) ................................. 88115699

(51) Int. Cl.$^7$ .................................................. F23D 11/10
(52) U.S. Cl. .................. 239/418; 239/419; 239/421; 239/422; 239/424; 239/425; 239/427; 239/427.5; 239/428
(58) Field of Search .................... 239/418, 419, 239/421, 422, 423, 424, 424.5, 425, 427, 427.5, 428, 427.3, 419.3; 118/319, 320, 52

(56) References Cited

U.S. PATENT DOCUMENTS 3,814,327 * 6/1974 Dada ................................. 239/424.5
4,946,475 * 8/1990 Lipp et al. ........................ 239/424.5
5,681,162 * 10/1997 Nabors, Jr. et al. .............. 239/424.5

* cited by examiner

Primary Examiner—David A. Scherbel
Assistant Examiner—Dinh Q. Nguyen
(74) Attorney, Agent, or Firm—Hung C. Lin (57) ABSTRACT

A dispensing nozzle device for dispensing processing materials to an output region, includes a body and a plurality of first conduits. The body is formed with a first chamber, a second chamber, a plurality of through holes in communication with the first chamber and the second chamber, and a dispensing nozzle conduit for communicating the second chamber with the output region. The plurality of first conduits are respectively in communication with the plurality of through holes and have a plurality of openings received within the second chamber. A gap is formed between each of the first conduits and corresponding one of the plurality of through holes.

6 Claims, 6 Drawing Sheets

DISPENSING NOZZLE DEVICE

FIELD OF THE INVENTION

The present invention relates to a dispensing nozzle device, and more particularly, to a dispensing nozzle device having a self-cleaning function.

BACKGROUND OF THE INVENTION

In a manufacturing process of semiconductor devices or liquid crystal displays (LCDs) including wet etching, cleaning, wet spin etching, coating, and developing, various kinds of dispensing nozzles are utilized. A conventional dispensing nozzle is disclosed in FIG. 2 of U.S. Pat. No. 5,312,487.

Figure 1A:
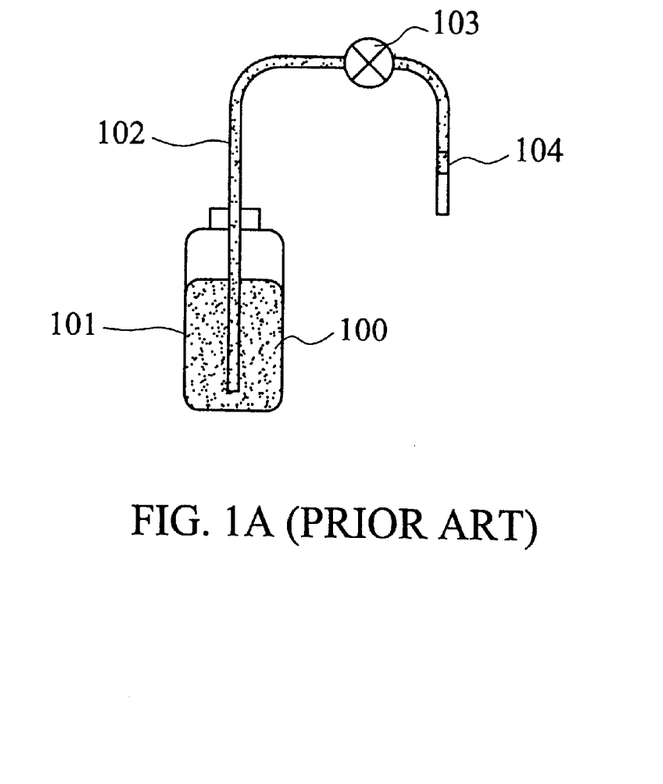
FIG. 1A is a schematic view showing a conventional dispensing nozzle system.

Referring to FIG. 1A, a conventional dispensing system includes a storage tank 101 for storing a processing material 100, a delivery pipeline 102 for transporting the processing material 100, a control valve 103 for controlling the flow of the processing material 100, and a nozzle 104 for dispensing the processing material 100 onto a wafer (not shown) or glass substrate (not shown) to be processed.

Figure 1B:
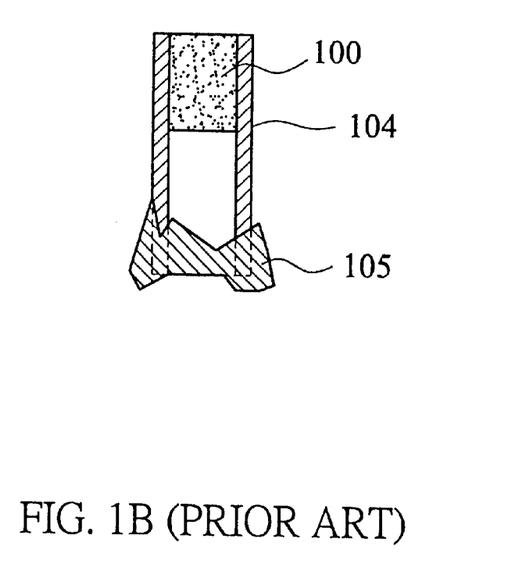
FIG. 1B is an enlarged view showing the dispensing nozzle of FIG. 1.

The processing material 100 is represented by dots in FIGS. 1A and 1B. After the processing steps have been completed and the control valve 103 is closed, the processing material 100 remained at the dispensing nozzle 104 changes it property or gets hardened because of its contact with air. Thus, a hardened substance 105 is formed around the dispensing nozzle 104, as shown in FIG. 1B. The hardened substance 105 is mixed with the processing material 100 in the subsequent treatment and is dispensed onto the wafer or glass substrate. As a result, the processing material is polluted, and the wafer or the glass substrate can be damaged.

In some dispensing nozzle systems, when the function of the dispensing nozzle is disabled, a suck-back valve is employed to suck back the processing material so as to prevent the processing material from remaining at an outlet of the dispensing nozzle. However, the proper functions of the suck-back valve are disabled due to the aging thereof or the chemical reaction between the materials and the suck-back valve. As a result, the processing material gradually leaks and drops onto the wafer or the glass substrate. In this case, the product quality of the wafer or the glass substrate can be adversely affected.

Figure 2:
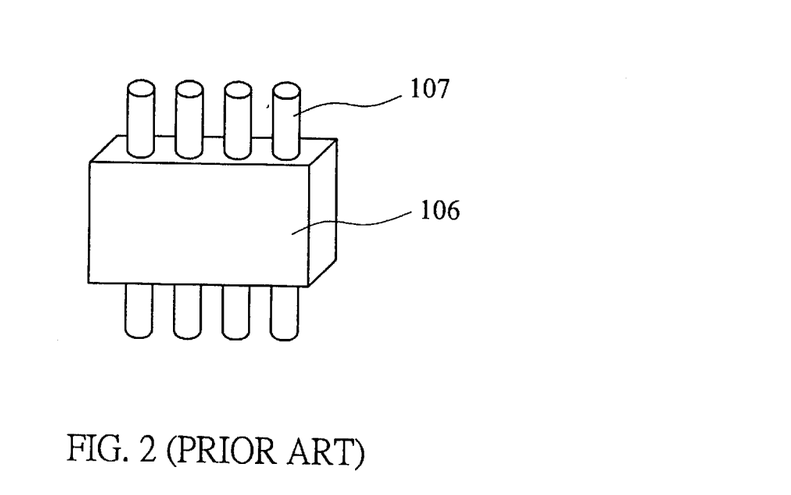
FIG. 2 is a view showing a conventional linearly arranged multi-nozzle device.

Referring to FIG. 2, a conventional multi-nozzle device includes a body 106 and four dispensing nozzles 107 arranged in parallel for providing four kinds of processing materials. In order to let a wafer or glass substrate be processed properly, the processing materials have to be uniformly dispersed onto the wafer or glass substrate. Thus, to dispense one of the processing materials, the body 106 has to be properly positioned so as to let the corresponding dispensing nozzle 107 initially align with the center of the wafer or glass substrate and subsequently the body 106 is gradually shifted so that the processing material is uniformly distributed throughout the wafer or glass substrate.

In general, in order to prevent the processing materials from being splashed to the backside of the wafer or the glass substrate, none of the dispensing nozzles 107 is allowed to dispense the processing materials outside the wafer or glass substrate. Therefore, the shifting range of the multi-nozzle device has to be smaller than that of the single nozzle device 104 shown in FIG. 1. In this case, some processing materials cannot be dispensed throughout the entire surface to be treated of the wafer or glass substrate. The details will be described in the following with reference to FIGS. 3A and 3B.

Figure 3A:
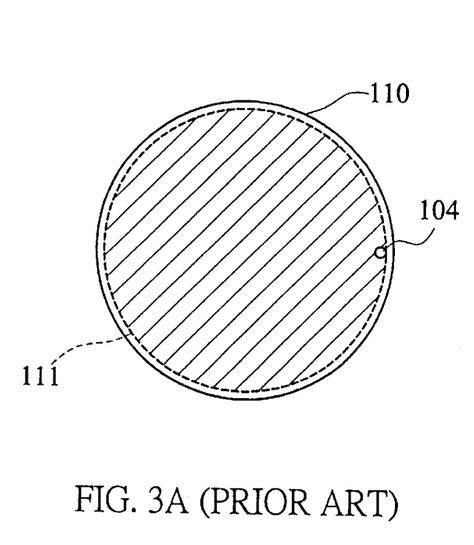
FIG. 3A is a diagram showing the dispensing area on a substrate of the conventional dispensing nozzle device as shown in FIG. 1A.

Referring to FIG. 3A, a to-be-treated wafer or glass substrate is represented by a substrate 110. The processing region in which the dispensing nozzle 104 is allowed to shift is the area within a circle 111. The maximum range in which the dispensing nozzle 104 is allowed to shift above the substrate 110 is the area within the circle 111.

Figure 3B:
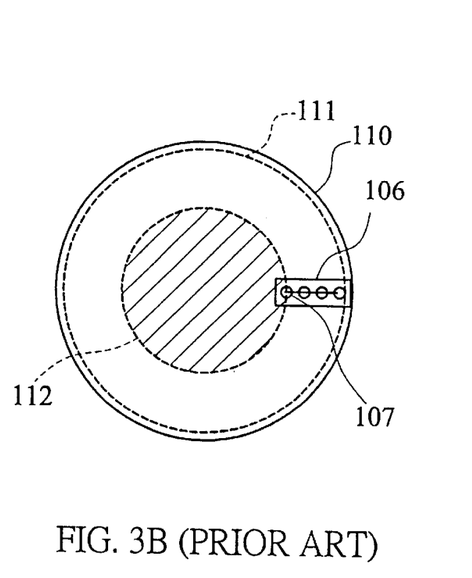
FIG. 3B is a diagram showing the dispensing area on a substrate of the conventional multi-nozzle device as shown in FIG. 2.

Referring to FIG. 3B, a to-be-treated wafer or glass substrate is designated as a substrate 110. The processing region in which the rightmost dispensing nozzle 107 is allowed to shift is the area within a circle 111. The maximum processing region in which the leftmost dispensing nozzle 107 is allowed to shift is the area within a circle 112 due to that the processing region in which the rightmost dispensing nozzle 107 is allowed to shift is limited by the circle 111.

Thus, if the dispensing nozzle device shown in FIG. 2 is used, the dispensing region is small and the movement of the dispensing nozzle cannot be easily controlled. If the dispensing nozzle device is required to dispense the processing material to the substrate center, the method for adjusting each of the dispensing nozzles 107 to the substrate center is complicated and cannot be easily completed.

Figure 4:
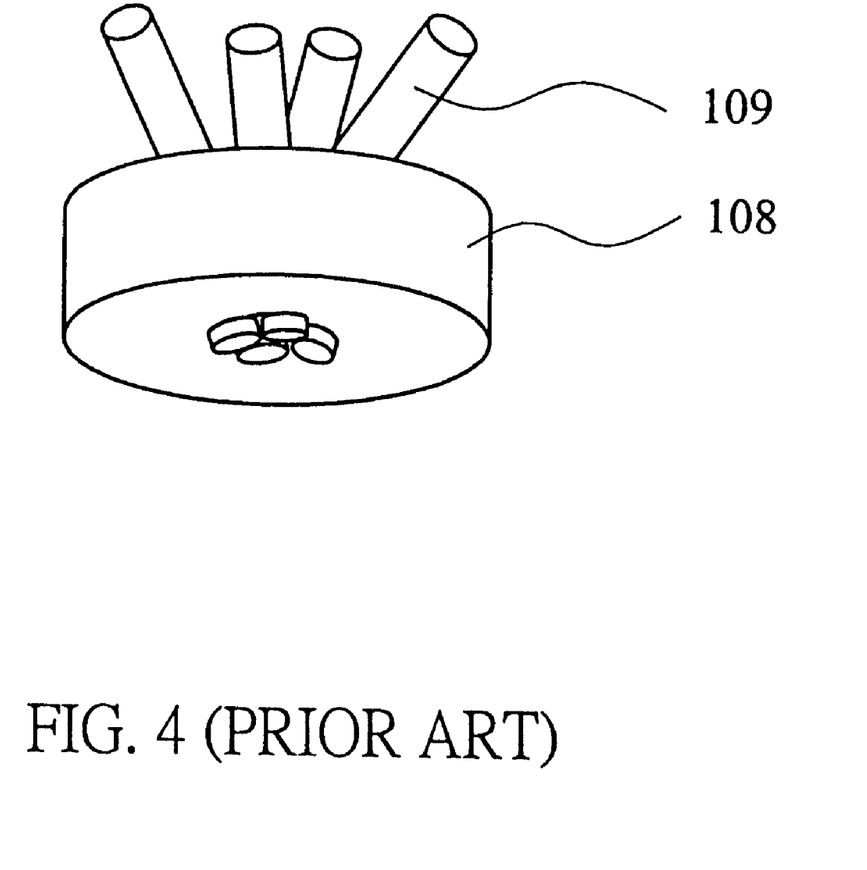
FIG. 4 is a view showing a conventional circularly arranged multi-nozzle device.

Referring to FIG. 4, a conventional multi-nozzle device is provided with a body 108 and four dispensing nozzles 109 arranged in a circular shape. The processing materials dispensed from the dispensing nozzles 109 are directly dispensed to the center point of the wafer or the glass substrate by a proper design. As the processing materials dispensed from the dispensing nozzle are not perpendicularly impinged onto the wafer or the glass substrate, the slantingly dispensed processing material can damage the patterns on the wafer or the glass substrate. Furthermore, the slantingly dispensed processing material cannot be dispersed to deep trenches formed on the wafer or glass substrate. Thus, the quality of the product is adversely affected. Moreover, the slantingly dispensed processing material causes a lateral force that can topple the wafer or the glass substrate.

SUMMARY OF THE INVENTION

It is therefore an object of the present invention to provide a dispensing nozzle device capable of selectively providing various kinds of processing materials and capable of preventing the processing materials from remaining at the dispensing nozzle. In addition, the dispensing nozzle device is capable of dispensing the processing materials throughout the entire surface to be treated of the wafer or glass substrate, and capable of eliminating the slantingly dispensed processing material which causes a lateral force to topple the wafer or glass substrate. This dispensing nozzle device can also provide atomized processing material such that the atomized processing material can be uniformly distributed throughout the wafer or glass substrate.

In accordance with a first aspect of the invention, a dispensing nozzle device for dispensing processing materials to an output region includes a body and a plurality of first conduits. The body is formed with a first chamber, a second chamber, a plurality of through holes in communication with the first chamber and the second chamber, and a dispensing nozzle conduit for communicating the second chamber with the output region. The plurality of first conduits are respectively in communication with the plurality of through holes and have a plurality of openings received within the second chamber. A gap is formed between each of the first conduits and corresponding one of the plurality of through holes.

In accordance with a first aspect of the invention, the dispensing nozzle device is capable of selectively providing various kinds of processing materials via a plurality of first pipelines and capable of cleaning the processing materials remained at the opening. Thus, the hardening of the processing materials remaining at the opening can be avoided.

According to a second aspect of the invention, the body in accordance with the first aspect of the invention further includes a third circular chamber substantially surrounding the second chamber, and at least two first bypass conduits substantially symmetrical to the dispensing nozzle conduit and in communication with the third circular chamber and the output region. Therefore, the lateral pushing forces as a result of slantingly dispensed processing materials on the wafer or glass substrate can be eliminated.

According to a third aspect of the invention, the body in accordance with the first aspect of the invention the body further includes a third circular chamber substantially surrounding the second chamber, at least one first bypass conduit communicating with the third circular chamber and the dispensing nozzle conduit, a fourth chamber substantially surrounding the dispensing nozzle conduit, and at least two second bypass conduits substantially symmetrical to the dispensing nozzle conduit for communicating with the fourth chamber and the output region. The dispensing nozzle device is capable of atomizing the processing materials and uniformly premixing the processing materials. Therefore, the processing materials are uniformly dispensed onto the wafer or the glass substrate.

DETAILED DESCRIPTION OF THE PREFERRED EMBODIMENTS

1. First Embodiment.

Figure 5:
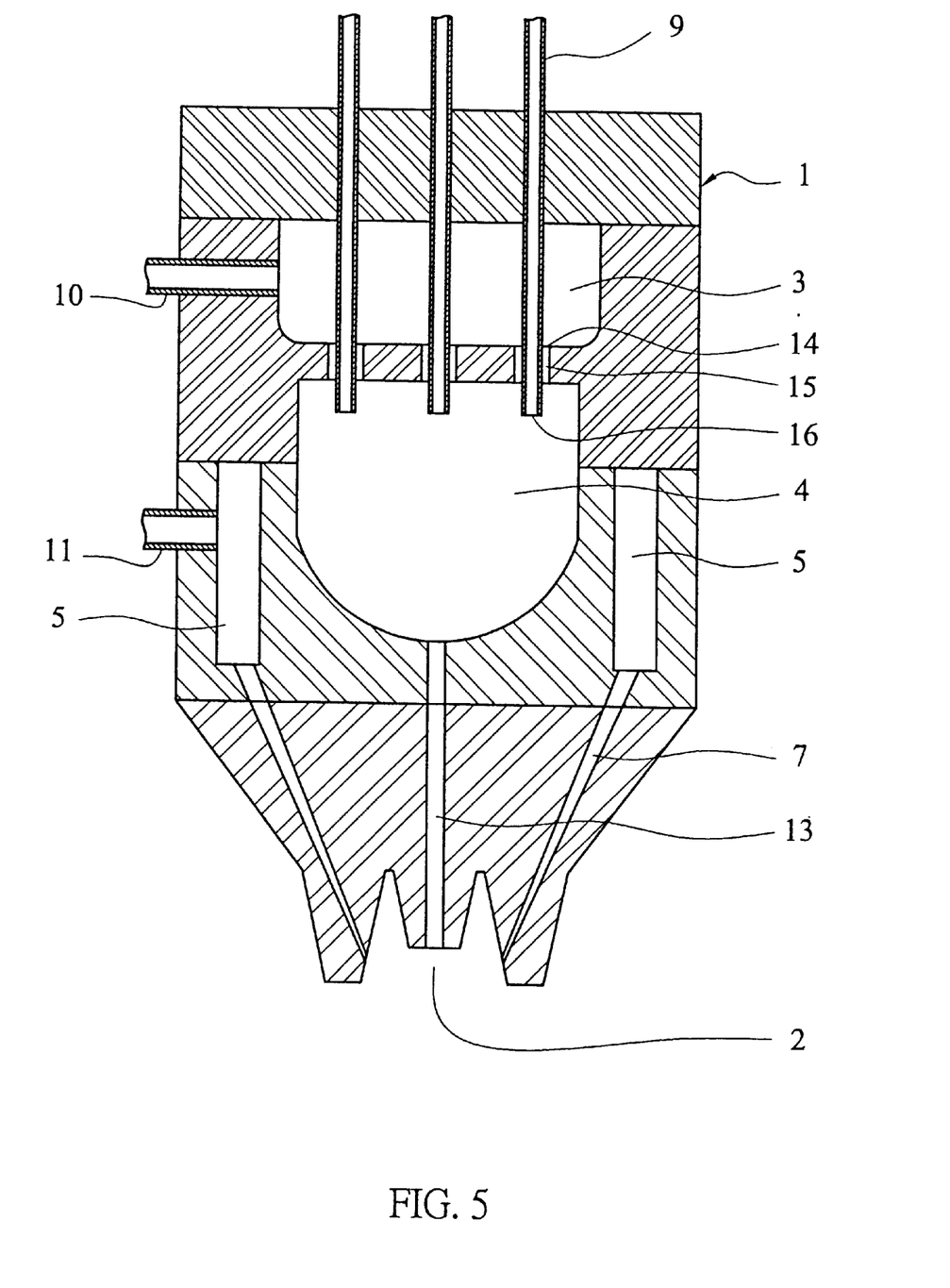
FIG. 5 is a cross-sectional view showing a dispensing nozzle device in accordance with a first embodiment of the invention.

Referring to FIG. 5, the dispensing nozzle device for dispensing processing material to an output region 2 includes a body 1, five first pipelines 9, a second pipeline 10, and a third pipeline 11. The body 1 is formed with a first chamber 3, a second chamber 4, a third circular chamber 5, two first bypass conduits 7, a nozzle conduit 13, and five through holes 14. It should be noted that the number of the first pipelines 9 is five rather than three because two first pipelines 9 are in alignment with the middle first pipeline 9 in a direction perpendicular to the sheet of the drawing. Similarly, the number of the through holes 14 is five rather than three.

The first chamber 3 and the second chamber 4 are in communication with each other by the five through holes 14. The nozzle conduit 13 communicates with the second chamber 4 and the output region 2. The output region 2 is an outlet for dispensing processing material. The third circular chamber 5 circularly surrounds the second chamber 4. The two first bypass conduits 7, arranged symmetrically to the nozzle conduit 13, are in communication with the third circular chamber 5 and the output region 2.

The five first pipelines 9 penetrate through the first chamber 3 and the through holes 14 and have five openings 16 received in the second chamber 4. A gap 15 is formed between each of the five first pipelines 9 and the internal surface of a corresponding through hole 14. The second pipeline 10 is in communication with the first chamber 3 and processing materials arc transferred to the first chamber 3 through the second pipeline 10. The third pipeline 11 is in communication with the third circular chamber 5 and processing materials are supplied to the third circular chamber 5 through the third pipeline 11.

In the first embodiment, the dispensing paths of processing materials in this nozzle device include:

i) the path of dispensing processing materials into the second chamber 4 via the first pipelines 9 and then dispensing processing materials to the output region 2 via the dispensing nozzle conduit 13;

ii) the path of dispensing processing materials into the first chamber 3 from the second pipeline 10 to let processing materials enter the second chamber 4 via the gap 15, and then dispensing processing materials to the output region 2 via the dispensing nozzle conduit 13; and iii) the path of dispensing processing materials into the third circular chamber 5 from the third pipeline 11, and then dispensing processing materials to the output region 2 via the first bypass conduits 7.

It should be noted that the above dispensing paths can be carried out individually or at least two paths can be carried out simultaneously.

The processing materials can be selected from chemical liquids and/or gases, depending on the requirements of the manufacturing process.

Figure 6:
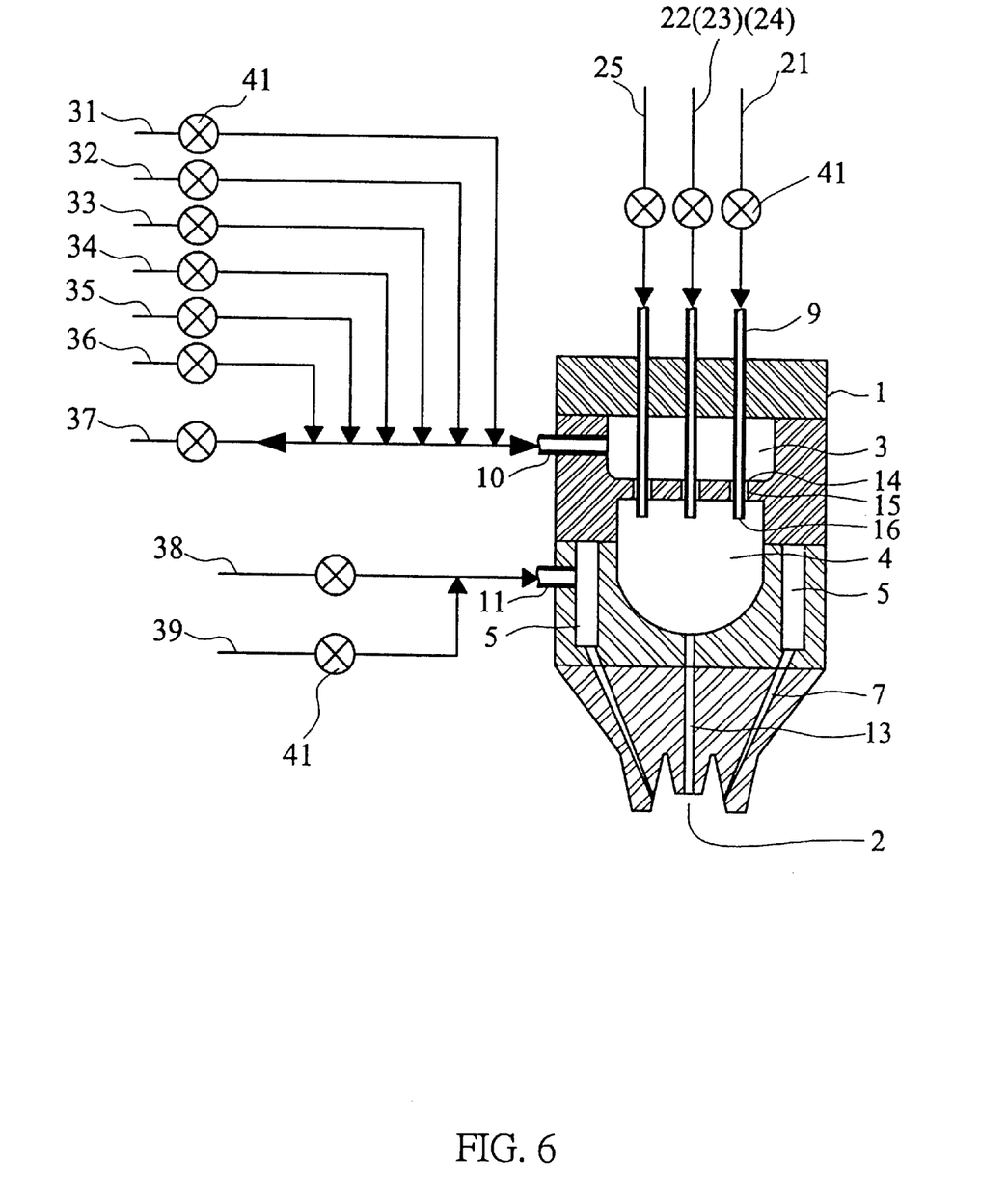
FIG. 6 is a schematic view showing the dispensing nozzle system utilizing the dispensing nozzle device shown in FIG. 5.

Referring to FIG. 6, the five first pipelines 9 are connected to the pipelines 21 to 25 for supplying processing materials. The second pipeline 10 is connected to the pipelines 31 to 37 for supplying another kinds of processing materials. The third pipeline 11 is connected to the pipelines 38 to 39 for supplying yet another knids of processing materials.

Control valves 41 are respectively provided for each of the pipelines 21 to 25 and 31 to 39 for controlling the ON/OFF states thereof. The arrows as shown in FIG. 6 indicate the flowing directions of processing materials.

The pipelines 21 to 25 are used to provide five kinds of processing materials A to E. The pipelines 31 to 35 are used to provide five kinds of processing materials A' to E'. The pipeline 36 is used to provide nitrogen or air, and the pipeline 37 is used for vacuuming the first chamber 3. The pipeline 38 is used to provide nitrogen or a special gas, and the pipeline 39 is used to provide chemical agents. The processing materials A' to E' are used to clean the materials A to F. Thus, the dispensing nozzle device of the first embodiment provides the functions described below.

At least one of the processing materials A to E is selectively provided to the second chamber 4 via the pipelines 21 to 25, and then, processing materials flow out from the dispensing nozzle conduit 13.

Nitrogen or air is provided via the second pipeline 10 so as to pressurize the material within the second chamber 4 and to let processing materials flow out from the dispensing nozzle conduit 13.

Nitrogen, other special gases, or chemical agents can be provided to the third circular chamber 5 via the third pipeline 11, and then, the above material can be dispensed via the first bypass conduits 7.

The processing materials A' to E' for cleaning the first pipeline 9 are provided to the first chamber 3 via the second pipeline 10. Then, the processing materials A to E retaining at the openings 16 are cleaned by the processing materials A' to F' via the gap 15 so as to prevent the processing materials A to E retaining at the openings 16 from being hardened or changed in nature.

As the first bypass conduits 7 are arranged symmetrically to the dispensing nozzle conduit 13, the lateral forces caused by the impinging of the processing materials dispensed via the first bypass conduits 7 can be balanced. Therefore, toppling of the wafer or glass substrate can be avoided.

2. Second Embodiment

Figure 7:
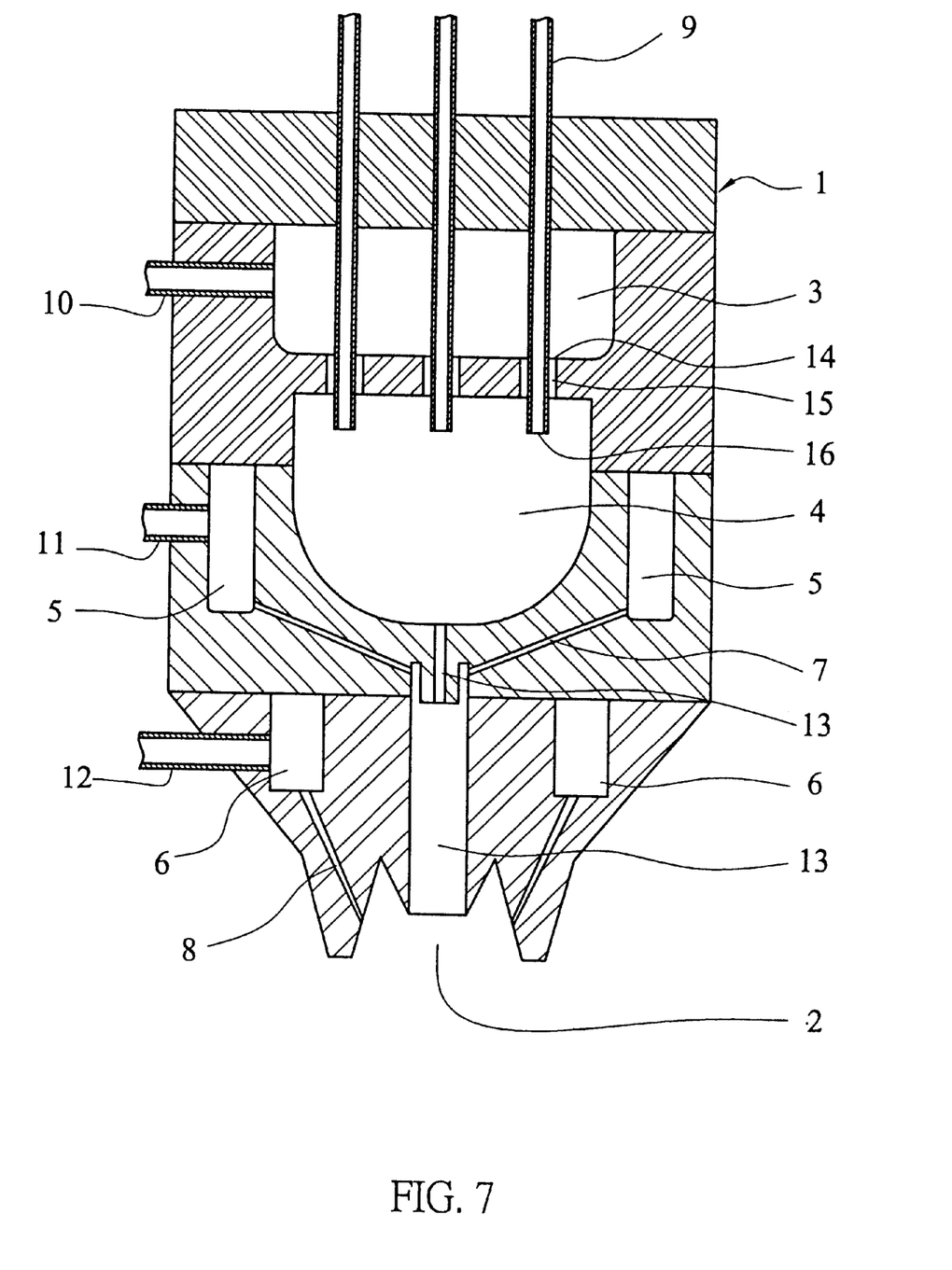
FIG. 7 is a cross-sectional view showing a dispensing nozzle device in accordance with a second embodiment of the invention.

Referring to FIG. 7, the dispensing nozzle device includes a body 1, five first pipelines 9, a second pipeline 10, a third pipeline 11, and a fourth pipeline 12. The body 1 is formed with an output region 2, a first chamber 3, a second chamber 4, a third circular chamber 5, a fourth chamber 6, two first bypass conduits 7, two second bypass conduits 8, a nozzle conduit 13, and five through holes 14. It should be noted that the number of the first pipelines 9 is five rather than three because two first pipelines 9 is in alignment with the middle first pipeline 9 in a direction perpendicular to the sheet of the drawing. Similarly, the number of the through holes 14 is five rather than three.

The first chamber 3 and the second chamber 4 are in communication with each other by the five through holes 14. The nozzle conduit 13 is in communication with the second chamber 4 and the output region 2. The third circular chamber 5 circularly surrounds the second chamber 4. The two first bypass conduits 7, arranged symmetrically to the conduit 13, are in communication with the third circular chamber 5 and the dispensing nozzle conduit 13. The fourth chamber 6 circularly surrounds the dispensing nozzle conduit 13. The two second bypass conduits 8, arranged symmetrically to the nozzle conduit 13, are in communication with the fourth chamber 6 and the output region 2.

The five first pipelines 9 penetrate through the first chamber 3 and the through holes 14 and have five openings 16 received in the second chamber 4. A gap 15 is formed between each of the five first pipelines 9 and the internal surface of a corresponding through hole 14. The second pipeline 10 is in communication with the first chamber 3 and processing materials are dispensed to the first chamber 3 through the second pipeline 10. The third pipeline 11 is in communication with the third circular chamber 5 and processing materials are supplied into the third circular chamber 5 through the third pipeline 11.

The five first pipelines 9, from the exterior penetrate through the first chamber 3 and the through holes 14 and have the five openings 16 received in the second chamber 4. A gap 15 is formed between the each of the five first pipelines 9 and the internal surface of a corresponding through holes 14,. The second pipeline 10 is in communication with the first chamber 3 to supply processing materials to the first chamber 3, and the third pipeline 11 is in communication with the third circular chamber 5 to supply processing materials to the third circular chamber 5.

In the second embodiment, the dispensing paths of processing materials in this nozzle device includes:

i) the path of dispensing processing materials into the second chamber 4 via the first pipelines 9 and then dispensing processing materials to the output region 2 via the dispensing nozzle conduit 13;

ii) the path of dispensing processing materials into the first chamber 3 from the second pipeline 10 to let processing materials enter the second chamber 4 via the gap 15, and then dispensing processing materials to the output region 2 via the dispensing nozzle conduit 13;

iii) the path of dispensing processing materials into the third circular chamber 5 via the third pipeline 11, dispensing processing materials to the dispensing nozzle conduit 13 via the first bypass conduits 7, and dispensing processing materials through the output region 2; and iv) the path of inputting processing materials to the fourth chamber 6 via the fourth pipeline 12 and dispensing processing materials through the output region 2.

It should be noted that the above dispensing paths can be carried out individually or at least two paths can be carried out simultaneously.

The processing materials can be selected from chemical liquids and/or gases, depending on the requirements of the manufacturing process.

The functions of the second embodiment are substantially the same as those of the first embodiment. However, the second embodiment further includes the following function. In detail, nitrogen can be provided to the third circular chamber 5 via the third pipeline 11, and then, nitrogen is dispensed to the dispensing nozzle conduit 13 via the first bypass conduits 7. As for the processing materials from the second chamber 4, a function of atomizing and uniformly pre-mixing the processing materials is further obtained.

While the invention has been described by way of example and in terms of the preferred embodiments, it is to be understood that the invention is not limited to the disclosed embodiments. To the contrary, it is intended to cover various modifications. Therefore, the scope of the appended claims should be accorded the broadest interpretation so as to encompass all such modifications. For instance, in the first embodiment, the third circular chamber 5, the third pipeline 11, and the first bypass conduits 7 can be removed without losing the function of cleaning the opening 16 of the first pipelines 9. Furthermore, in the second embodiment, the first bypass conduits 7 do not need to be arranged symmetrically to the dispensing nozzle conduit 13. The reason is that processing materials dispensed via the first bypass conduits 7 does not slantingly impinge onto the to-be-treated wafer or glass substrate. Therefore, the number of the first bypass conduits 7 is not limited to two.

What is claimed is:

1. A self cleaning dispensing nozzle device for dispensing materials to an output region, comprising:

a first chamber, a second chamber in communication with the first chamber through a plurality of through holes;

a dispensing nozzle conduit, formed between the second chamber and the output region for dispensing processing materials to the output region;

a plurality of pipelines each going through each one of said through holes to the second chamber; and a circular gap formed between each one of said pipelines and corresponding through hole for a liquid cleaning material to flow over the outside surface of the pipelines to clean the tips of the pipelines.

2. The dispensing nozzle device according to claim 1 further comprising a second conduit in communication with said first chamber for supplying processing materials to said first chamber.

3. A dispensing nozzle device for dispensing processing materials to an output region, comprising:
- a body formed with a first chamber, a second chamber, a plurality of through holes in communication with said first chamber and said second chamber, and a dispensing nozzle conduit for communicating said second chamber with the output region, and
- a plurality of first conduits respectively in communication with said plurality of through holes and having a plurality of openings within said second chamber, a gap being formed between each of said first conduits and the internal surface of the corresponding one of said plurality of through holes, wherein said body further comprises:
  - a third circular chamber substantially surrounding said second chamber; and
  - at least two first bypass conduits substantially symmetrical to said dispensing nozzle conduit and in communication with said third circular chamber and said output region.

4. The dispensing nozzle device according to claim 3 further comprising:
- a second conduit in communication with said first chamber for supplying processing materials to said first chamber; and
- a third conduit in communication with said third circular chamber for supplying processing materials to said third circular chamber.

5. A dispensing nozzle device for dispensing processing materials to an output region, comprising:
- a body formed with a first chamber, a second chamber, a plurality of through holes in communication with said first chamber and said second chamber, and a dispensing nozzle conduit for communicating said second chamber with the output region, and
- a plurality of first conduits respectively in communication with said plurality of through holes and having a plurality of openings within said second chamber, a gap formed between each of said first conduits and the internal surface of the corresponding one of said plurality of through holes, wherein said body further comprises:
  - a third circular chamber substantially surrounding said second chamber;
  - at least one first bypass conduit communicating with said third circular chamber and said dispensing nozzle conduit; and
  - at least two second bypass conduits substantially symmetrical to said dispensing nozzle conduit and communicating with said fourth chamber and said output region.

6. The dispensing nozzle device according to claim 3 further comprising:
- a second conduit in communication with said first chamber for supplying processing materials to said first chamber;
- a third conduit in communication with said third circular chamber for supplying processing materials to said third circular chamber; and
- a fourth conduit in communication with said fourth chamber for supplying processing materials to said fourth chamber.

* * * * *